United States Patent [19]

Dautremont-Smith et al.

[11] Patent Number: 5,334,306
[45] Date of Patent: Aug. 2, 1994

[54] METALLIZED PATHS ON DIAMOND SURFACES

[75] Inventors: William C. Dautremont-Smith, Westfield; Leonard C. Feldman, Berkeley Heights, both of N.J.; Rafael Kalish, Haifa, Israel; Avishay Katz, Westfield, N.J.; Barry Miller, Murray Hill, N.J.; Netzer Moriya, Maplewood, N.J.

[73] Assignee: AT&T Bell Laboratories, Murray Hill, N.J.

[21] Appl. No.: 973,611

[22] Filed: Nov. 19, 1992

Related U.S. Application Data

[63] Continuation-in-part of Ser. No. 927,772, Aug. 10, 1992, abandoned, which is a continuation-in-part of Ser. No. 870,741, Apr. 17, 1992, abandoned, which is a continuation-in-part of Ser. No. 806,934, Dec. 11, 1991, abandoned.

[51] Int. Cl.$^5$ .............. C25D 5/02; C25D 5/54; C25D 7/12
[52] U.S. Cl. .............. 205/131; 205/123; 205/118; 205/159; 205/205; 205/209; 437/173
[58] Field of Search .............. 205/123, 159, 131, 205, 205/209, 220, 118; 437/173

[56] References Cited

U.S. PATENT DOCUMENTS

| | | | |
|---|---|---|---|
| 4,296,144 | 10/1981 | Maby et al. | 427/38 |
| 4,458,346 | 7/1984 | Mitsuyu et al. | 369/126 |
| 4,511,783 | 4/1985 | Burgemeister | 219/121 |
| 4,646,282 | 2/1987 | Mizuno et al. | 369/126 |
| 4,833,328 | 5/1989 | Prins et al. | 250/370 |
| 4,851,794 | 7/1989 | Williams et al. | 333/33 |
| 4,906,953 | 3/1990 | Li et al. | 333/36 |
| 4,939,485 | 7/1990 | Eisenberg | 333/104 |
| 5,002,899 | 3/1991 | Geis et al. | 437/173 |
| 5,065,282 | 11/1991 | Polonio | 361/399 |
| 5,093,647 | 3/1992 | Noda et al. | 338/160 |

FOREIGN PATENT DOCUMENTS 442006 8/1991 European Pat. Off. .
450381 10/1991 European Pat. Off. .

OTHER PUBLICATIONS

Yas et al., Metal–Graphite Materials of High Graphite Content and Some Methods of Their Preparation; pp. 27–29; Jun. 1976.

*Primary Examiner*—Kathryn Gorgos
*Attorney, Agent, or Firm*—D. I. Caplan

[57] ABSTRACT

A graphite path is formed along the surface of a diamond plate, preferably a CVD diamond plate, by means of a laser or ion-implantation induced conductivity. The path advantageously can be the surface of a sidewall of a via hole drilled by the laser through the plate or a path running along a side surface of the plate from top to bottom opposed major surfaces of the plate. The graphite path is metallized, as by electroplating or electroless plating. In this way, for example, an electrically conducting connection can be made between a metallized backplane located on the bottom surface of the plate and a wire-bonding pad located on the top surface of the plate.

16 Claims, 2 Drawing Sheets

METALLIZED PATHS ON DIAMOND SURFACES

This application is a continuation-in-part of application Ser. No. 07/92772, filed on Aug. 10, 1992, now abandoned; which is a continuation-in-part of application Ser. No. 07/870741 filed Apr. 17, 1992, now abandoned; which is a continuation-in-part of application Ser. No. 07/806934 filed Dec. 11, 1991, (abandoned).

TECHNICAL FIELD

This invention relates to methods of forming a metallized path located on a surface of a diamond body as well as to devices made by such methods and, more particularly, to methods of electrically interconnecting a pair of electrically conducting metallic layers located on opposite major surfaces of an electrically insulating diamond plate.

BACKGROUND OF THE INVENTION

An electronic device, such as a semiconductor laser, is typically mounted on a submount for the purposes of mechanical stability, heat dissipation, and electrical connections to one or more electrical sources (d-c and a-c control voltages or currents, or both). Because of its desirably higher thermal conductivity, diamond appears as an attractive alternative to silicon or to thermally conductive ceramics for the choice of material for the submount.

In general, the submount is in the form of a die that has been diced (cut) from a plate (wafer), and the device is located on a portion of a top surface of the die. Typically, there is also located on the top major surface of the die, among other things, a metallic wire-bonding pad to which one end of a metallic wire is attached, the other end of the wire being attached to an electrode located on a top major surface of the device. In this way, by connecting (attaching) one end of an additional wire to the bonding pad and the other end to an external electrical power source, a low electrical resistance connection is made to the electrical source. This additional wire, however, entails an undesirable additional amount of bonding pad area, as well as introduces an amount of added inductance that is especially undesirable as the a-c frequency of operation of the device increases.

In prior art, when using silicon as the material for the submount, the metallic bonding layer is deposited on the top surface of a silicon dioxide layer that has been formed on the top surface of the silicon wafer (prior to dicing). The purpose of the silicon dioxide layer is to supply electrical isolation of the metallic bonding pad from the (semiconductive) silicon die. Then, for each die to be cut from the wafer, an aperture (via hole) penetrating from the bottom to the top surface of the wafer is wet-etched; and the resulting (sloping) sidewall of the via hole, together with the bottom surface of the wafer, is coated with a metallic layer, such as by evaporation or sputtering. Ordinarily, because silicon is somewhat fragile, only then is the thickness of the silicon wafer reduced to its ultimately desired amount, by lapping, grinding, and polishing the bottom surface of the wafer, whereby the metallic layer on its bottom is also removed; and, after the silicon wafer is thus thinned to the desired thickness, its thus exposed bottom surface is again coated with a metallic layer. The metallic layer located on the bottom surface of the wafer (the "metallized backplane") supplies a desirable means for the added access from the external power source to the bonding pad (through the via hole): after dicing the silicon wafer, electrical contact from the electrical power source directly to the metallized backplane, and hence indirectly to the bonding pad (through the metallic coated sidewall) can easily be made—namely, by soldering the metallized backplane of the submount to the top surface of a metallic mounting body ("platform'-")—without the need for the undesirable additional wire connection from the power source to the bonding pad located on the top surface of the wafer. Thus, a microstrip transmission line is formed, the metallized bottom surface of the plate serving as the backplane of the transmission line, having a characteristic impedance that is determined by the various geometric parameters of the resulting configuration and the dielectric constant of the silicon.

As mentioned above, however, the material for the submount, diamond has more attractive qualifies than silicon. In addition, diamond is less fragile than silicon; therefore, a diamond plate does not require thinning after the formation of the via hole. Moreover, by reason of the method used in prior art, the bonding pad extends across the entire top of the aperture in the silicon wafer, whereby the resulting self-supporting portion of the bonding pad is fragile and unreliable during subsequent processing, especially during subsequent bonding of the submount to the platform at necessarily elevated temperatures. More specifically, in prior art, since the via hole is wet-etched, it is wet-etched at a time when the bonding pad has already been formed: if the via hole were to be wet-etched prior to the time when the bonding pad is formed, followed by the formation of the bonding pad itself and a metallic coating on the sidewall of the aperture, then the required electrical connection between the metallic coating on the sidewall and either the bonding pad or the metallized backplane (or both) would be unreliable because of the sharp angular geometry at the respective intersections between the sidewall and either the top surface or the bottom surface of the wafer (or both the top surface and the bottom surface of the wafer).

Although when using a diamond plate as the material for the submount, it is possible to connect a deposited (typically evaporated or sputtered) metallic layer located on the bottom surface of the diamond plate with a deposited metallic layer located on the top surface of the plate by means of a deposited metallic layer located on an end (side) surface of the plate, the deposited metallic layer running from the bottom surface to the top surface of the plate, the resulting connection is weak, and hence unreliable, in regions overlying the top or bottom edges (or both edges) of the plate—i.e., at the intersections of the top and bottom surfaces with the side surface of the plate—again because of the relatively sharp angular geometry at these intersections.

Therefore, it would be desirable to have a method of forming a metallized path connecting opposed metallized surfaces of a diamond plate—or any metallized arbitrary path located on a diamond surface—that mitigates the problems of prior art.

SUMMARY OF THE INVENTION

A metallized path located on a surface of a diamond body, such as a path located on the sidewall surface of a via hole (aperture) in a diamond plate or a path located on any other surface of a diamond body, is formed in accordance with the invention by means of a laser or ion beam that is incident on the body—more particularly by laser-drilling the aperture or laser-scribing ion beam implanting a (graphite) path on the surface of the body, respectively, followed by plating a metal on the resulting graphite layer (i.e., graphitic surface layer) that has formed (during the laser drilling or the laser-scribing) on the sidewall surface of the via hole or on the surface of the body, respectively, where the laser beam was incident. Preferably, the plating of the metal is performed by electroplating in which electrical contact to the graphite layer, for the purpose of forming an electrode contact for the electroplating, is furnished by a previously deposited metallic layer located on the surface of the body, the deposited metallic layer contacting the graphite layer.

In cases where the path extends over an edge of a surface of the body—for example, a path formed by a via hole (drilled into the plate from its bottom to top surface by the laser) or a path running along a side surface that extends from the top to the bottom surface of a diamond plate, such as for the purpose of electrically inter-connecting a pair of metallic layers located on top and bottom surfaces—by virtue of the graphitizing of the surface of the diamond by the laser, the regions of the plated metallic layer located overlying the edge are expected to be strong and reliable. The term "edge" includes, for example, the intersection of the sidewall of the via hole or a side surface of the diamond plate, respectively, with the top or bottom surface of the diamond plate. More generally, the term "edge" includes the intersection of any pair of surfaces of the body—such as a pair of surfaces that are essentially planar in a neighborhood of the edge, especially in cases where the angle between them is equal to approximately $\pi/2$ radian or less. More particularly, in cases where a connection between metallic layers located on opposite major (top and bottom) surfaces of a diamond plate is to be formed by means of a metal-plated laser-drilled (graphitized) aperture through the plate, the metallic layers are both deposited advantageously prior to the laser-drilling (especially the metallic layer whose surface is reached by the laser-drilling after the via hole through the diamond has been drilled). Thus, the laser-drilling is advantageously performed so that the aperture penetrates through both metallic layers. In this way, there will be no (undesirable) self-supporting portion of either of the metallic layers.

As an alternative to laser-writing or laser-drilling for defining (by graphitizing) the path on the diamond surface, patterned ion implantation can be used.

In order to form a resistor, the thus ion-implanted or laser-written graphitized region of the diamond is electroplated with a metallic coating such as gold, followed by patterning the thus electroplated metallic coating in such a manner as to produce a gap between at least two separated portions of the electroplated metallic coating (i.e., two separated portions of the electroplated metallic coating that remain overlying two respective separated portions of the ion implanted region). A resistor is thus formed by the ion-implanted (or laser-written) graphitized path running between the two separated portions of the electroplated metallic coating. The resistance of this resistor can be controlled by controlling the width of the gap (i.e., the distance of separation between the two separated portions of the electroplated metallic coating and by proper choice of the ion implantation parameters—ion species, ion dose, ion energy, and temperature of the diamond body). The two separated portions of the electroplated metallic coating serve as contacts for opposing ends of the resistor.

BRIEF DESCRIPTION OF THE DRAWING(S)

Only for the sake of clarity, none of the Figures is drawn to any scale.

DETAILED DESCRIPTION

Figure 1:
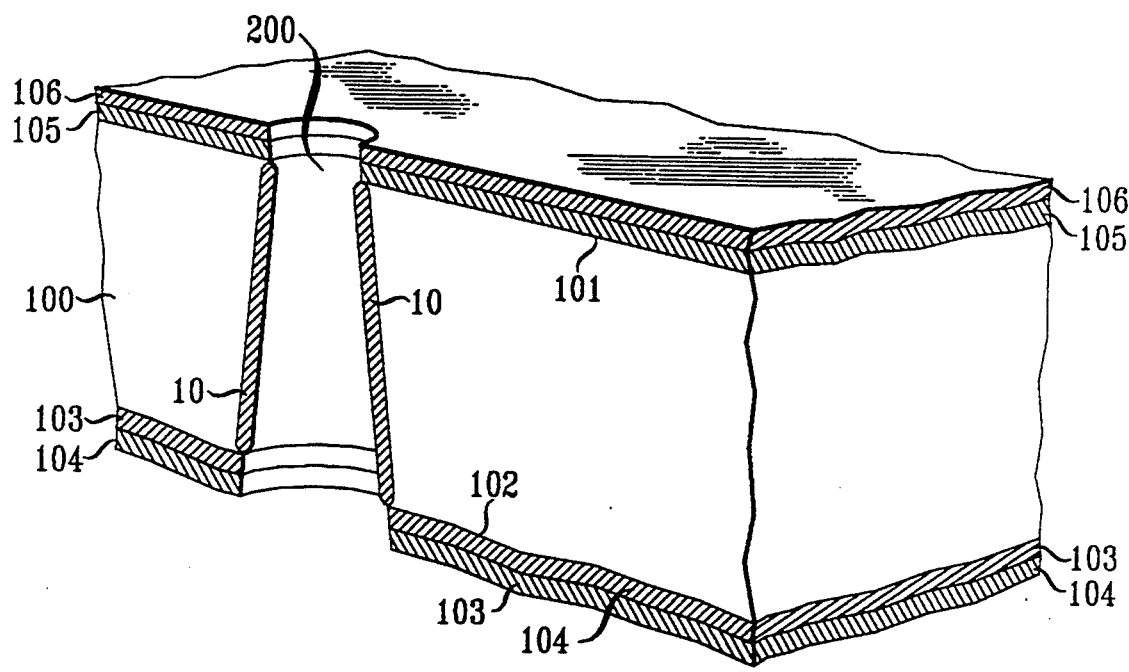
FIGS. 1 and 2 are elevational perspective side views in cross section of various stages in the manufacture of a structure in accordance with a specific embodiment of the invention.

Referring to FIG. 1 a diamond body or plate 100, preferably a chemically vapor deposited (CVD) diamond plate, has parallel top and bottom major surfaces 101 and 102, respectively. Typically, the thickness of the slab 100 is in the approximate range of 100 to 500 $\mu$m, preferably 200 to 300 $\mu$m.

On the bottom major surface 102 is located a metallic adhesion layer 103, typically titanium; and on the adhesion layer 103 is located an electrically conducting layer 104, typically tungsten or nickel. The thicknesses of both layers 103 and 104 are typically in the approximate range of 0.02 to 0.10 $\mu$m. The layers 103 and 104 form and serve as an electrically conducting backplane.

On the top major surface 101 of the plate 100 is located an adhesion layer 105, typically titanium having a thickness in the approximate range of 0.02 $\mu$m to 0.10 $\mu$m. On the top surface of the adhesion layer 105 is located an electrically conducting layer 106, typically tungsten or nickel having a thickness in the approximate range of 0.02 $\mu$m to 0.10 $\mu$m.

The metallized backplane formed by the layers 103 and 104 has an aperture (via hole) 200 that penetrates all the way through itself, the diamond plate 100 and the entire thickness of the conducting layer 106.

To form the structure shown in FIG. 1, the various metallic layers 103, 104, 105, and 106 located on the bottom and top surfaces of the slab 100 are deposited by standard evaporation or sputtering techniques. A laser beam, typically having a circular cross section, is then directed at normal incidence with respect to the layer 104 for a time that is sufficient to drill the via hole 200, advantageously penetrating through the diamond body 10 as well as through the layers 105 and 106. As a result of this laser-drilling, the sidewall of the aperture 200 is graphitized—i.e., becomes coated with a graphite layer 10. In particular, this graphite layer 10 extends from a cylindrical portion of the bottom surface 102 to a cylindrical portion of the top surface 101 of the plate 100.

The diameter of the via hole 200 is typically in the approximate range of 25 to 100 $\mu$m, and its sidewall makes an angle of approximately 5 angular degrees (0.09 radian) with respect to the normal to the bottom and top major surfaces of the plate 100. The thickness of the graphite layer 10 is in the approximate range of 0.02 $\mu$m to 0.10 $\mu$m.

Figure 2:
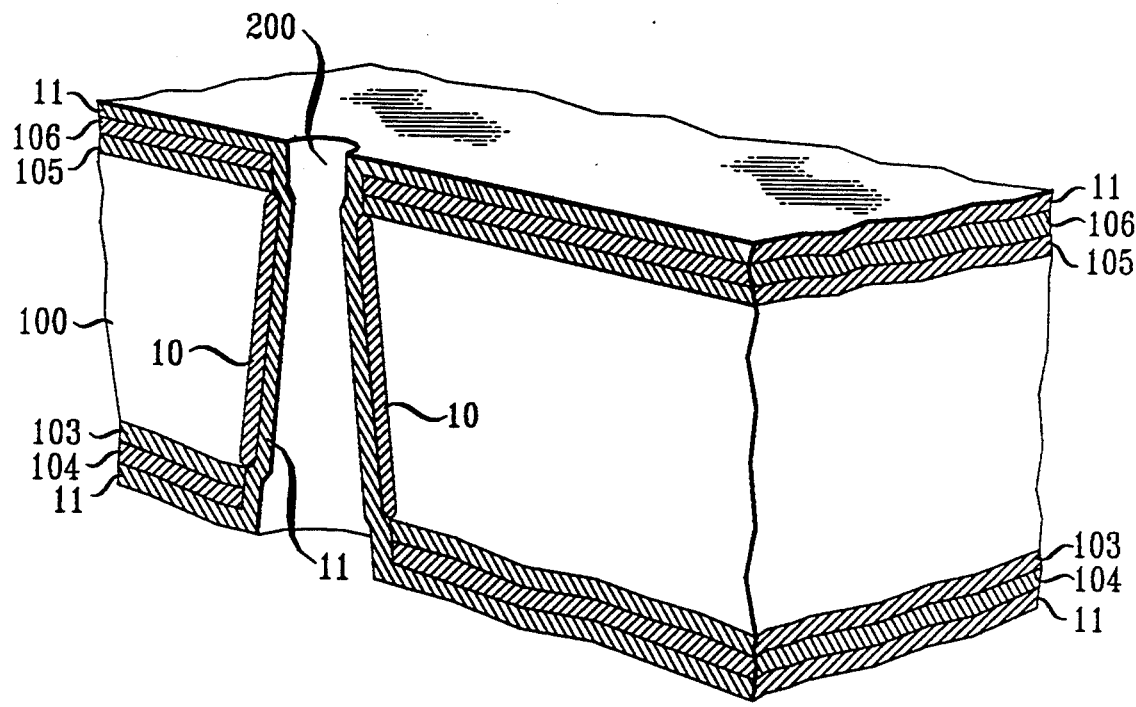

Next (FIG. 2), using the electrically conducting layers 104 and 106 as a common cathode in a standard electroplating path, a metallic layer 11 is electroplated on the surface of the graphite layer 10—i.e., on the sidewall of the aperture 200—as well as on the surfaces of the layers 104 and 106. This metallic layer 11 is typically tungsten, nickel, or chromium, having a thickness in the approximate range of 0.02 μm to 0.10 μm. In this way, the conducting layers located on the bottom and top major surfaces of the diamond plate 100 are electrically interconnected by the thus electroplated layer 11. Preferably the metallic layer 11 is made of the same metal as that of the metallic layers 104 and 106.

Next, everywhere on the bottom surface of the conducting layer 104, an adhesion layer (not shown), followed by a barrier layer and a bonding layer (not shown), are deposited. This adhesion layer is again typically titanium, having a thickness of typically approximately 0.02 μm; the barrier layer is typically tungsten having a thickness of approximately 0.05 μm; and the bonding layer is typically gold having a thickness of approximately 0.5 μm. Similarly, everywhere on the top surface of the conducting layer 106, a titanium adhesion layer (not shown), followed by a gold bonding layer, is deposited.

Figure 3:
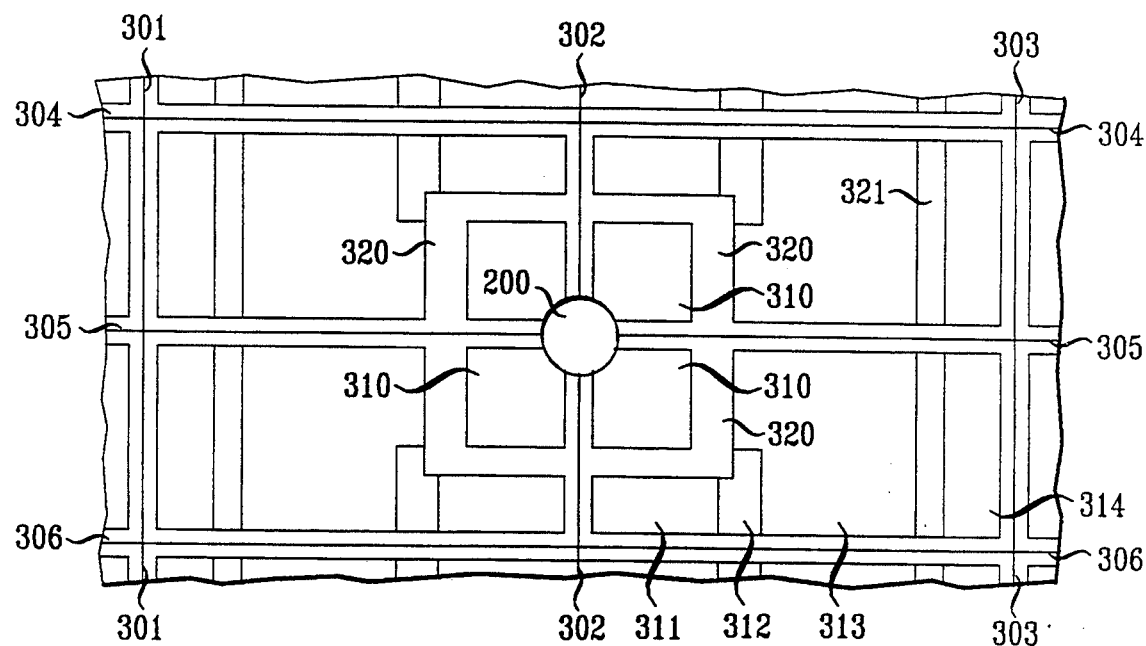
FIG. 3 is a top view of a further stage in the manufacture of a structure in accordance with a specific embodiment of the invention.

Referring to FIG. 3 (the bottom right-quadrant of which will be described in detail, the other quadrants being similar to it, including its mirror image), the metal layers located on the top major surface 101 of the diamond plate are patterned, to form a patterned metallization on the top major surface 101 of the diamond plate 100 (as more fully described below), prior to scribing the resulting structure along planes 301, 302, 303, 304, 305, and 306. Advantageously, the planes 302 and 305 intersect at the center of the aperture 200. In this way, four assemblies for separately mounting four lasers are formed from the plate 100. Many more such assemblies can be formed by extending the patterned metallization along the top surface of the diamond plate 100.

More specifically, all the metallic layers that are located on the top major surface 101 of the diamond plate 100 are lithographically etched—such as by reactive ion etching, for example, with a gaseous mixture of $CF_4$ and $H_2$—in order to form (FIG. 3) metallized regions 310, 311, 312, 313, and 314. That is, the metallized region 310 is separated by a first gap region 320 from the metallized regions 311, 312, and 313; the metallized region 313 is separated by a second region from the metallized region 314; the metallized region 311 is contiguous with the metallized region 312; and the metallized region 312 is contiguous with the metallized region 313.

Next, by means of a standard lithographic technique, such as lift-off, a resistive layer 321, typically tantalum nitride, is formed in the second gap region, in order to connect the metallized regions 313 and 314. The thickness of this resistive layer 321 is sufficient to supply a resistance of typically approximately 20Ω or 50Ω between the metallized regions 313 and 314—depending on the impedance that is desired for matching to the a-c power supply.

Next, still another adhesion layer—typically titanium having a thickness of approximately 0.02 μm—and a bonding layer are deposited on top and bottom surfaces of the structure being built. The bonding layer is typically gold having a thickness of approximately 0.5 μm. Whereas these adhesion and bonding layers are deposited everywhere on the bottom surface of the structure, they are formed, as by a standard lithographic lift-off technique, overlying only the metallized regions 310, 311, 313, and 314, but not the metallized region 312. Then, a solder layer, such as gold-tin, is formed, as by a standard lithographic lift-off technique, overlying only the metallized region 313. The purpose of not having the gold bonding layer extend over the metallized region 312 is to prevent the flow of solder from the metallized region 313 to the surface of the metallized region 311 where the presence of solder would interfere with the subsequent attachment of a wire bond, as described more fully below.

Next, the structure being built is diced along the planes 301, 302, 303, 304, 305, and 306, whereby four separate dies are formed. In particular, the metallized bottom surface of each die is bonded to a metallic mounting body (not shown), as known in the art.

Next, a bottom electrode of a laser device (not shown) is bonded to the metallized region 313, with the aid of the gold-tin solder layer. The method taught in U.S. Pat. No. 5,197,654, entitled "Bonding Method Using Solder Composed of Multiple Alternating Gold and Tin Layers", is especially useful for this purpose. Then one end of a wire bond or ribbon bond (not shown) is attached to the metallized region 310, and the other end is attached to a top electrode located on the top surface of the laser device. Next, the metallized backplane of the structure being built is bonded to a metallic mounting body ("platform; not shown"), typically by means of a lead-tin solder.

For a normal electrical operation, a power source (not shown), including a dc source connected in series with an ac (RF) source, is connected between the metallized region 314 and the platform. The polarity of the dc source is arranged so as to forward bias the laser device. The platform is connected to the metallized region 314. Thereby the following electrical path is established: platform, the metallic layer 11, the metallized region 310, the wire bond, from top to bottom electrodes of the laser device, the metallized region 313, the resistive layer 321, the metallized region 314, and the power source.

The power source is thus electrically connected to and through the platform to the metallized backplane, as well as to the metallized region 310 by virtue of that part of the metallic layer 11 which is located on the sidewall of the via hole 200 and which thus electrically interconnects the metallized region 310 and the metallized backplane. Thus, this pan of the metallic layer 11 reduces the number of wire bonds that must be attached to the top surface of the structure during the normal operation.

For a testing electrical operation, a power source (not shown) is connected between the metallized regions 310 and 311. The electrical path is then as follows: metallized region 310, the wire bond, from top to bottom electrodes of the laser device, the metallized region 313, the solder dam 312, the metallized region 311, and the power source. In this way, the resistive layer 321 is bypassed, but if desired a resistor can be incorporated in series with the power source. More important, the laser device can thus be tested without the expense of bonding the metallized backplane of the platform.

Instead of the sidewall of the via hole 200 being shared by each of four separate dies, a separate via hole located in the midst of each metallized region 310 can be laser-drilled in each such die. Also, after the formation of the metallic layer 11, instead of tungsten, the barrier layer can be platinum or nickel. Instead of a laser device, any electronic device that has a top electrode and requires applied voltages (whether a-c, d-c, or both a-c and d-c) can be mounted on the metallized region 313.

Figure 4:
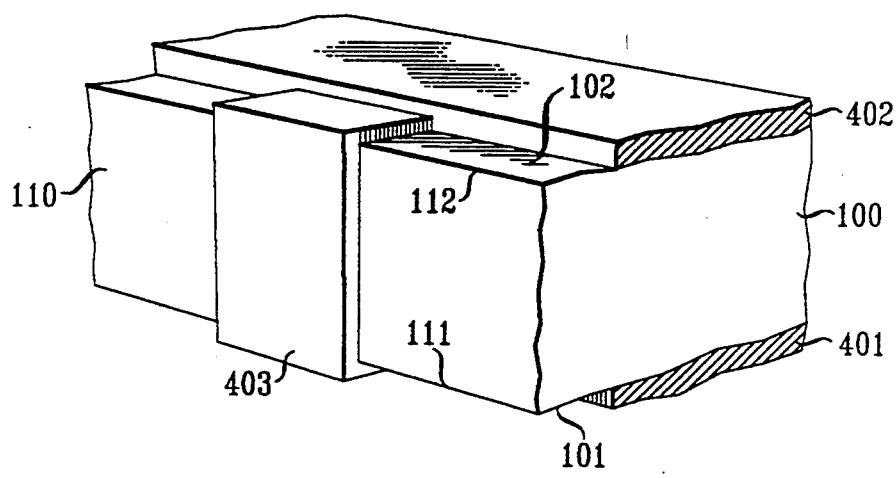
FIG. 4 is an elevational perspective side view of a structure manufactured in accordance with another specific embodiment of the invention.

FIG. 4 shows an alternative scheme of connecting a pair of metallic layers 401 and 402 located on opposed (top and bottom) surfaces 101 and 102 of the diamond plate 100. This plate has a side (end) surface 110 that intersects the bottom surface 102 of the plate 100 along a bottom edge 111 thereof and that intersects the top surface 101 of the plate 100 along a top edge 111 thereof. The metallic layers 401 and 402 are metallically interconnected by a metallic layer 403. More specifically, this metallic layer 403 runs from the metallic layer 401 along the bottom surface 102 of the plate, overlies the bottom edge 112, runs up along the side surface 110 of the plate 100, overlies the top edge 111, and runs along the top surface 101 of the plate 100 to the metallic layer 402. The metallic layer 403 overlies a graphite path that has been scribed (graphitized) by means of a laser beam incident on those portions of the bottom surface 102, the side surface 110, and the top surface 101 where the metallic layer 403 is desired.

In order to form the structure shown in FIG. 4, a laser beam is directed on the top, side, and bottom surfaces of the diamond plate 100, whereby a graphite path running along the surface of the diamond plate is formed (diamond surface is graphitized) by the beam wherever it is incident on the surface of the plate 100. Then, metallic layers are deposited, as by evaporation or sputtering, on the bottom and top surfaces 102 and 101 of the plate 100. These layers are patterned in such a manner as to expose at least a portion of each of the top and bottom edges 111 and 112 of the plate 100 that overlies the graphite path and at the same time as to overlap an end portion of the path. Next, the graphite path is plated, as by electroplating—typically with tungsten, nickel, or chromium—whereby the metallic layer 403 is formed, thus metallically interconnecting a pair of respective top and bottom metallic layers 401 and 402. This metallic layer 403 thus has a lateral extent that essentially coincides with the lateral extent of the underlying graphite path. During the electroplating, either or both (preferably both) of the metallic layers 401 and 402 are connected to the negative pole of the d-c source being used for the electroplating. If desired the metallic layer 402 or 401 (or both) can be further patterned.

As an alternative to laser-writing of laser-drilling for defining (by graphitizing) the path on the diamond surface, patterned ion implantation can be used. In order to form a resistor, the thus ion-implanted (or laser-written) graphitized region of the diamond is electroplated with a metallic coating such as gold, followed by patterning the thus electroplated metallic coating in such a manner as to produce a gap between at least two separated portions of the electroplated metallic coating (i.e., two separated portions of the electroplated metallic coating that remain overlying two respective separated portions of the ion implanted region). A resistor is thus formed by the ion-implanted (or laser-written) graphitized path running between the two separated portions of the electroplated metallic coating. The resistance of this resistor can be controlled by controlling the width of the gap (i.e., the distance of separation between the two separated portions of the electroplated metallic coating or other ion implantation parameters). The two separated portions of the electroplated metallic coating serve as contacts for opposing ends of the resistor. In one such alternative, ions of a metal (such as palladium or platinum) that is catalytic for the electroless plating (to follow the ion implantation) are implanted into the diamond body or plate in accordance with a desired pattern, in order to provide a (patterned) region, containing the catalytic metal, that reaches the surface of the diamond. After thus forming this region containing the catalytic metal, immersion of the diamond into a standard electroless bath can be used to plate such metals as nickel, copper, or gold onto the patterned region. Further processing can then be used, as described above, for the thus electroplated diamond body or plate. In another alternative, by use of a standard photolithographic technique, after ion implantation the entire surface of the diamond body or plate is coated with a patterned photoresist layer with openings located therein where, and only where, plating with a metallic coating is desired. Then the diamond body or plate is coated with the patterned metallic coating, as by first catalyzing the surface, followed by metallizing the catalyzed portion of the surface, of the diamond. For example, a standard solution-immersion method can provide a catalytic surface for electroless deposition by dipping the diamond alternatingly into palladium chloride and stannous chloride solutions, whereby a catalytic surface is formed that contains palladium metal. Next the photoresist is removed, as with an organic solvent, whereby a catalytically patterned surface remains on the graphitized region. Then the graphitized region is metallized, for example, as described above, in conjunction with standard electroless baths.

For example, the ion-implanted region is formed by a direct-writing ion beam comprising ions of such atoms (or molecules) as platinum, cobalt, gold, copper, lead, tin, silicon, or other implantable ion. Typically, the dose level of the ions is in the approximate range of $10^{13}$-to-$10^{15}$/cm$^2$ (1E13-to-1E15 per square centimeter), and the ions have an energy typically in the approximate range of 30-to-150 keV, whereby the resistivity of the resulting (damaged, graphitized) implanted region is typically in the approximate range of 50-to-200 ohm-cm, as compared with a resistivity of the (un-implanted) CVD diamond body or plate of approximately 1E6 ohm-cm or more. It should be understood, of course, that if so desired this resistivity range can be expanded in either direction by varying the implantation parameters. Advantageously, during the ion implantation the diamond body or plate is maintained at an elevated temperature in the approximate range of 250° C. to 350° C.

The electro-deposited gold layer typically has a thickness such that the gold layer has a resistance in the approximate range of 10-to-100 ohm.

Although this invention has been described in terms of specific embodiments, various modifications can be made without departing from the scope of the invention. For example, the top and bottom surfaces 101 and 102 need not be parallel. Also, the side surface 110 can be oriented at an angle that is equal to or less than $\pi/2$ radian with respect to either of the surfaces 101 or 102, so that the resulting edge(s) can be relatively sharp.

Instead of electroplating, electroless plating can also be used. The diamond body can also be monocrystalline. Finally, the diamond body can be any other diamond-like coating or plate—such as amorphous hydrogenated carbon.

We claim:

1. A method of forming a metallized path located on a surface of a diamond body in accordance with a first selected path located on the surface of the body comprising the steps of:

(a) defining a second selected path on the surface of the body that comprises the first selected path by directing a laser beam or an ion beam onto the surface of the body in accordance with the second selected path, whereby a graphite path forms along the surface of the body in accordance with the second selected path; and (b) plating at least a selected portion of the graphite path with a metallic layer, whereby the metallized path is formed.

2. The method of claim 1 in which step (b) is performed by electroplating followed by patterning the metallic layer.

3. The method of claim 1 or 2 in which the beam is a laser beam and in which the laser beam forms an aperture penetrating through the diamond body from a first to a second major surface of the body, whereby the metallized path comprises a sidewall surface of the aperture extending from the first to the second major surface.

4. The method of claim 3 further comprising forming between steps (a) and (b) thereof a patterned resist layer on the surface of the body, the patterned resist layer having openings therein in accordance with the selected portion.

5. The method of claim 3 in which the first and second major surfaces are parallel.

6. The method of claim 5 further comprising further between steps (a) and (b) thereof a patterned resist layer on the surface of the body, the patterned resist layer having openings therein in accordance with the selected portion.

7. The method of claim 5 in which subsequent to step (b) the body is diced along first and second planes that intersect in the aperture.

8. The method of claim 7 further comprising forming between steps (a) and (b) thereof a patterned resist layer on the surface of the body, the patterned resist layer having openings therein in accordance with the selected portion.

9. The method of claim 1 or 2 in which the body has a side surface that is contiguous with first and second major surfaces of the body at first and second edges, respectively, and in which the graphite path extends along the side surface the body from the first edge to the second edge.

10. The method of claim 9 in which the graphite path extends along the first major surface to a metallic pad located on the first major surface.

11. The method of claim 10 further comprising forming between steps (a) and (b) thereof a patterned resist layer on the surface of the body, the patterned resist layer having openings therein in accordance with the selected portion.

12. The method of claim 9 further comprising forming between steps (a) and (b) thereof a patterned resist layer on the surface of the body, the patterned resist layer having openings therein in accordance with the selected portion.

13. The method of claim 2 further comprising the step of patterning the metallic layer.

14. The method of claim 2 further comprising forming between steps (a) and (b) thereof a patterned resist layer on the surface of the body, the patterned resist layer having openings therein in accordance with the selected portion.

15. The method of claim 1 further comprising the step of patterning the metallic layer.

16. The method of claim 1 further comprising forming between steps (a) and (b) thereof a patterned resist layer on the surface of the body, the patterned resist layer having openings therein in accordance with the selected portion.

* * * * *